Figure 1:
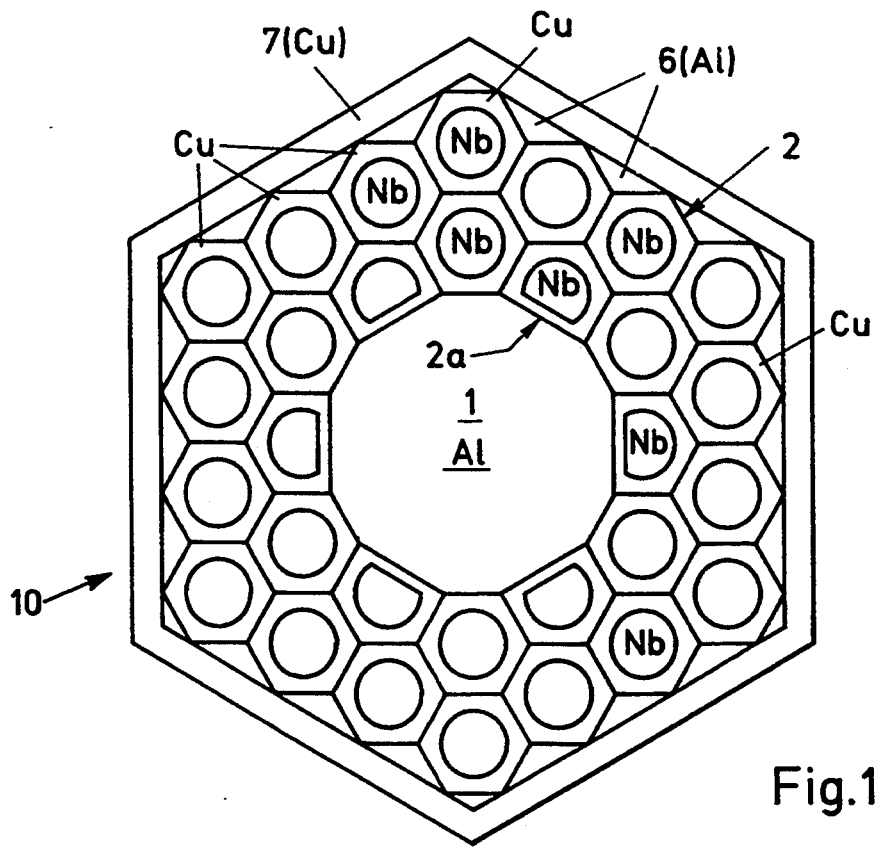

United States Patent [19]
Walters et al.

[11] Patent Number: 5,369,873
[45] Date of Patent: Dec. 6, 1994

[54] METHOD OF FABRICATING AN ELONGATED ARTEFACT

[75] Inventors: Colin R. Walters, Abingdon; Jan E. Evetts, Cambridge; Francis J. V. Farmer, Sutton Coldfield; Thomas J. Hawksley, Bromyard, all of England

[73] Assignee: British Technology Group Ltd., London, United Kingdom

[21] Appl. No.: 965,247
[22] PCT Filed: Jul. 5, 1991
[86] PCT No.: PCT/GB91/01097
§ 371 Date: Jan. 5, 1993
§ 102(e) Date: Jan. 5, 1993
[87] PCT Pub. No.: WO92/01316
PCT Pub. Date: Jan. 23, 1992

[30] Foreign Application Priority Data
Jul. 6, 1990 [GB] United Kingdom ............ 9014979.0

[51] Int. Cl.⁵ ............................................. H01L 39/24
[52] U.S. Cl. ........................................ 29/599; 505/928; 505/929; 505/930
[58] Field of Search ................... 29/599; 505/928, 929, 505/930

[56] References Cited

U.S. PATENT DOCUMENTS

| | | | |
|---|---|---|---|
| 3,925,882 | 12/1975 | Sannbrook | 505/929 X |
| 4,055,887 | 11/1977 | Meyer | 29/599 |
| 4,084,989 | 4/1978 | Meyer | 29/599 X |
| 4,224,735 | 9/1980 | Young et al. | |
| 4,490,439 | 12/1984 | Stekly et al. | 29/599 X |
| 4,531,982 | 7/1985 | Dubots | 29/599 X |
| 4,723,355 | 2/1988 | Both et al. | 29/599 |
| 4,863,804 | 9/1989 | Whitlow et al. | |
| 5,088,183 | 2/1992 | Kanithi | 29/599 |
| 5,223,348 | 6/1993 | Wong et al. | 29/599 X |

FOREIGN PATENT DOCUMENTS

| | | |
|---|---|---|
| 0054421 | 6/1982 | European Pat. Off. |
| 0119553 | 9/1984 | European Pat. Off. |
| 0169078 | 1/1986 | European Pat. Off. |
| 230567 | 12/1986 | European Pat. Off. |
| 1216494 | 12/1970 | United Kingdom |
| 1342117 | 12/1973 | United Kingdom |
| 1369048 | 10/1974 | United Kingdom |
| 1387621 | 3/1975 | United Kingdom |
| 1521346 | 8/1978 | United Kingdom |
| 2003766 | 3/1979 | United Kingdom |
| 2201830 | 9/1990 | United Kingdom |

OTHER PUBLICATIONS

Proceeding of the Seventh Symposium on Engineering of Fusion Research, Knoxville, Tenn., 25th 28th Oct. 1977, pp. 1278–1281, IEEE, New York, US; W. A. Fietz: "Conductors for Tokamak toroidal field coils" * p. 1280, right-hand column; p. 1281, FIG. 7*.

IEEE Transactions on Magnetics, vol. Mag-21, No. 2, Mar. 1985, pp. 157–160, IEEE, New York, US; Y. Takahashi et al.: "Development of 12 T-10 kA Al-s-tabilized Nb3Sn conductor for TMC-II" p. 157, full page.

Proceedings of the IEEE, vol. 77, No. 8, Aug. 1989, pp. 1110–1123, IEEE, New York, US; E. Gregory et al.: "Conventional Wire and cable Technology" * pp. 1116–1120, full pages*.

Primary Examiner—Carl J. Arbes
Attorney, Agent, or Firm—Cushman, Darby & Cushman

[57] ABSTRACT

A component 10 for making A15 Nb3Sn superconducting wire is of plane-filling cross-section after removing temporary additions 6, 7. It consists of a central pillar 1 of aluminium (later replaced by tin) surrounded by a two-deep array of polygonal copper columns 2/2a containing niobium rods. Many (e.g. 61) components 10 are voidlessly stacked together and extruded. The niobium rods adopt and retain a uniform distribution with minimum intervening material. This "sixty-one" member retains its shape during the extrusion and is itself of plane-filling cross-section. Several of them are voidlessly stacked together and on heat-treatment of the whole, the tin diffuses over a relatively short path and hence consistently into the rods, whereby there is formed a kilofilament Nb3Sn wire.

13 Claims, 4 Drawing Sheets

METHOD OF FABRICATING AN ELONGATED ARTEFACT

This invention relates to a method of fabricating an elongated artefact wherein the artefact comprises a matrix containing spaced parallel filaments along the direction of elongation.

An example of such an artefact is a superconducting wire. The superconducting component should not be thick normal to the current-carrying direction, i.e. it should be merely a filament, otherwise magnetic fields will set up wasteful eddy currents in the component. At the same time, a mere filament would be able to carry only a small current, and therefore a superconducting wire conventionally consists of many parallel non-touching filaments of superconductor embedded in a matrix which is conveniently an ohmic conductor such as bronze or copper.

The theoretical potential of for example A15 superconductors such as $Nb_3Sn$ has been known since 1960, but due mainly to their brittleness, in thirty years no ideal way of mass-producing them into wires has been found. Contributing to the difficulty is the requirement for the wires to include a continuous phase of pure copper, to act as a normal electrical conductor, heat sink and mechanical support in case the $Nb_3Sn$ is accidentally warmed above its superconducting range.

Most conventional ways rely on forming some precursor of the superconductor to the final required shape, then converting the precursor. For example, in the so called bronze route, rods of pure niobium are drawn down in a tin bronze to the extent that a fine wire is produced with filaments of niobium embedded in it. This precursor is then heated such that the niobium filaments are largely converted to niobium tin by reaction with the tin in the bronze. The main disadvantage of this route is that if there is more than 13% tin in the bronze it becomes progressively brittle during drawing until It finally breaks. This means that the mean current density in the final conductor is much reduced by the large volume of bronze required. (For clarity hereafter, the niobium is referred to as "filaments" even when thick enough, as at the outset, to count as "rods".)

The so called internal tin route attempts to avoid the requirement for this large volume of bronze by including the tin separately in the precursor in the form of pillars which are usually more than two orders of magnitude larger than the niobium filaments. There can be problems with drawing down even such precursors (the tin melts) and, as disclosed in UK Patent Application GB 2201830A, this can be partly mitigated by using aluminium in place of tin; at a later stage in the method, when the cross-section of the composite has been substantially reduced by drawing down or extrusion, the aluminium is removed from the composite and replaced with tin.

The composite (conventionally of circular cross-section) is extruded or drawn down, then an array of extruded composites is bundled together and further extruded, and so on, with as many of these stages as necessary. To avoid rupture of niobium filaments during the first extrusion, a relatively stout outer layer of copper is often left around the filaments. It will be seen that this leads to opposing design considerations. At each of these stages of bundling, these stout layers of copper or subsequent copper extrusion cans become part of the volume of the final conductor. Since copper competes with niobium for tin, this wastefully increases the amount of tin which must be provided and also increases the volume proportion of non-superconducting material. To minimise this effect, the number of extrusion/bundling stages can be reduced. This entails cramming many niobium filaments into each single starting composite while, for reasons of manufacturing practicability, the tin remains present in one rather thick pillar per composite. On heat treatment to react the niobium filaments with the tin, exchange of copper and tin between the regions thereof occurs via relatively long tortuous diffusion paths through the stack of filaments and predisposes towards the formation of Kirkendahl voids caused by the different rates of diffusion of copper and tin. This is self-evidently a waste of potential current-carrying volume. Any design is a compromise between these two effects.

The earlier-mentioned pure copper which is required is provided by enclosing arrays of composites inside barrier material such as tantalum, of thickness adequate to retain its integrity through extrusion, and encasing the whole in pure copper.

According to the present invention, there is provided a method of fabricating an elongated artefact comprising a matrix containing spaced parallel filaments along the direction of elongation, the method comprising voidlessly stacking filaments each encased in a tube of matrix material to form an assembly having a space-filling shape, applying filler strips and a reduction can, reducing the canned assembly, removing the can and the filler strips, voidlessly stacking a plurality of the reduced assemblies and reducing that stacked plurality.

The reduction may be by extrusion or drawing.

To the stacked plurality of the reduced assemblies, there may be applied filler strips and a reduction can before it is reduced. The then reduced stacked plurality may be chopped into lengths and the lengths then voidlessly stacked and then that voidless stack may itself be reduced.

The assembly may comprise, in addition to the filaments encased in tubes, a pillar of another material such as tin. gallium, germanium or aluminium or a removable extrudable precursor. The filaments may comprise niobium or other superconductor precursor or superconductor, and the matrix may comprise copper.

The invention extends to an elongated artefact made as set forth above. The said assembly may be a cylindrical component for use in fabricating superconducting wire, comprising a central pillar of a stanniferous, galliferous and/or germaniferous material or of an extrudable removable precursor thereof, or of aluminiferous material, preferably tin, surrounded by a two-deep array of cupriferous tubes each containing a niobiferous filament, at least the outer set of said columns being polygonal, and the cross-section of the component being a plane-filling shape, whether before or after extrusion. By "cylindrical" it is clear we mean the word In its topological sense, not the layman's sense of "right-circular cylinder", since the cylindrical component according to the illustrated example of the invention has a polygonal exterior. An advantage of the two-deep array is the shortening of the gallium/germanium/tin diffusion pathway from the central pillar to its most distant filament compared with GB 2201830 A, thus yielding a more uniform tin concentration in the product. The niobiferous metal may contain for example titanium and/or tantalum additives, which increase the upper critical field of Nb-Sn, e.g. Ti and/or Ta in quantities of up to 10% by weight.

As the cross-section of the component is a plane-filling shape, i.e., repeated indefinitely in the same size, an unlimited number of the components can be close-packed to fill a plane without voids. (Regular hexagons and squares are examples of plane-filling shapes, but a plane-filling component according to the invention would normally be more complex in shape.)

The component is preferably further surrounded by removable filler strips of an extrudable metal or alloy with a higher melting point than any one of tin, germanium or gallium, so profiled as to impart to said component a void-free extrudable cross-section, such as regular hexagon or a circle. Since presses capable of (the theoretically more ideal) hexagonal-to-hexagonal hydrostatic extrusion number well under one per continent, it is alternatively possible to make the component temporarily right-circular-cylindrical (using the removable filler strips) to widen the choice of providers of extrusion services the filler strips and any surrounding extrusion can being removed after the extrusion.

The invention extends to an Intermediate member comprising a close-packed array of the components made as set forth above (any of said removable filler strips having been removed). Because the said components are not surrounded by the previously necessary stout outer layer of copper, not only is tin saved and the volume more efficiently used for carrying current, but the spacing of the said tubes in the intermediate member is substantially constant even across the join between adjacent components, thus assisting uniformity of properties after heat-treatment (described later), reducing the risk of Kirkendahl voids and reducing the risk that when the niobium filaments are expanded by absorbing tin, neighbouring superconductor filaments from neighbouring arrays will come into contact, permitting wasteful eddy currents laterally to the length of the filaments.

The invention further extends to a method of fabricating a superconducting wire, comprising applying external filler strips to the said intermediate member, these strips being so profiled as to impart to the member a substantially void-free extrudable cross-section, which itself is preferably plane-filling, such as a regular hexagon, and may be surrounded by a diffusion barrier such as tantalum foil, optionally with an exterior niobium layer. The member (preferably then encased in an extrusion can) may then be worked (e.g. extruded or drawn) into the shape of a wire.

At some stage in the above, the central pillars may be removed (e.g. melted or dissolved out, for example if of aluminium, dissolved out by hot sodium hydroxide) and replaced by stanniferous metal, or aluminium may be left. Then the member may be heat-treated to diffuse the tin or aluminium across the tubes into the filaments, to form the Nb$_3$Sn or Nb$_3$Al superconductor in the form of spaced parallel filaments along the length of the member. The tubes effectively form a substantially continuous matrix, usually comprising copper.

Figure 1A:
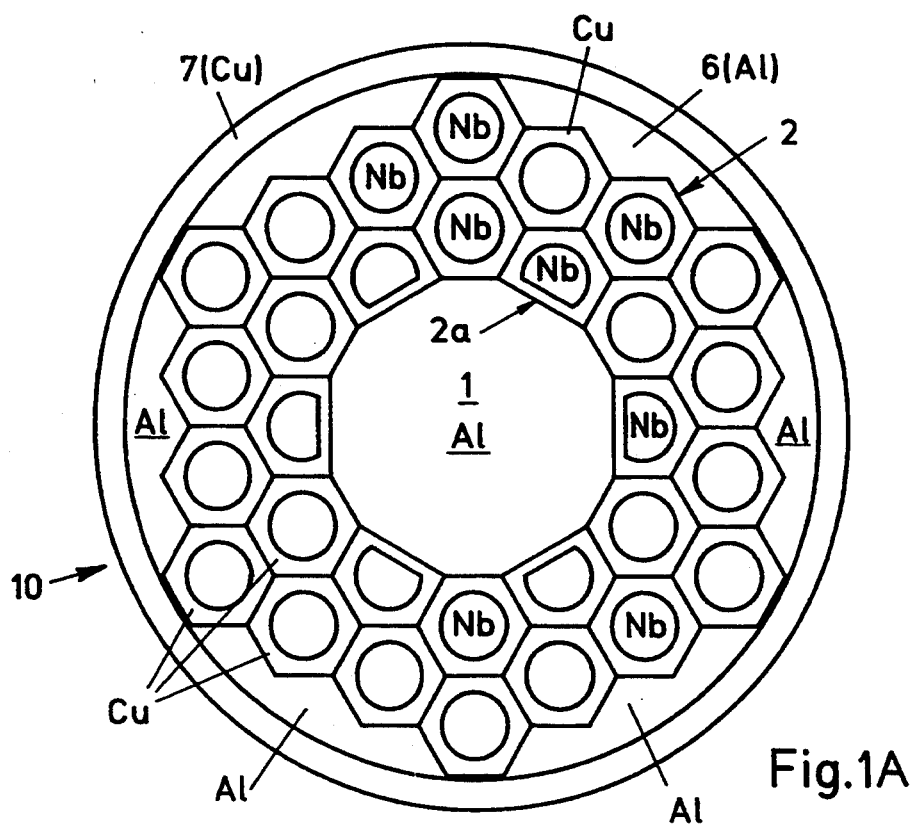
Figure 2:
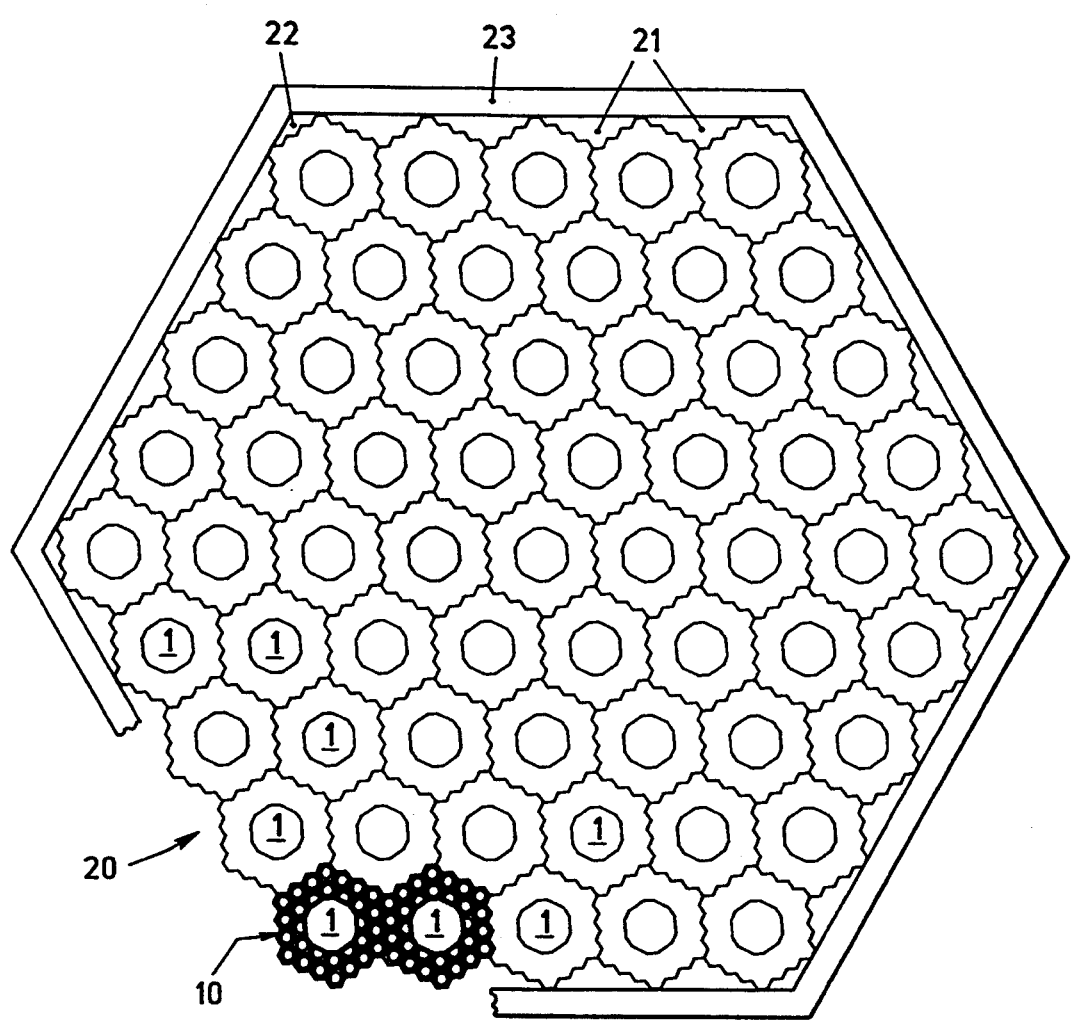
Figure 3:
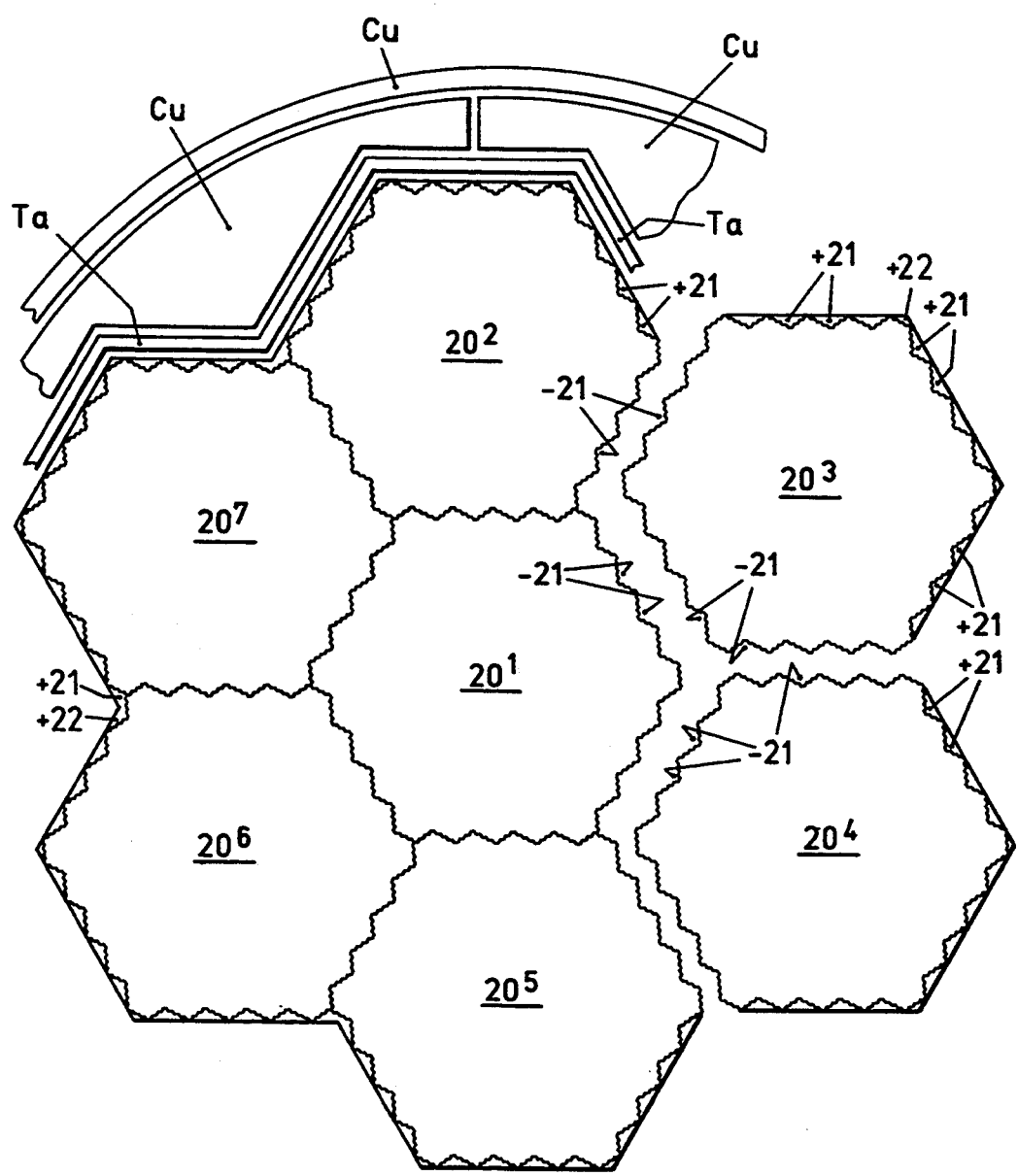
Figure 4:
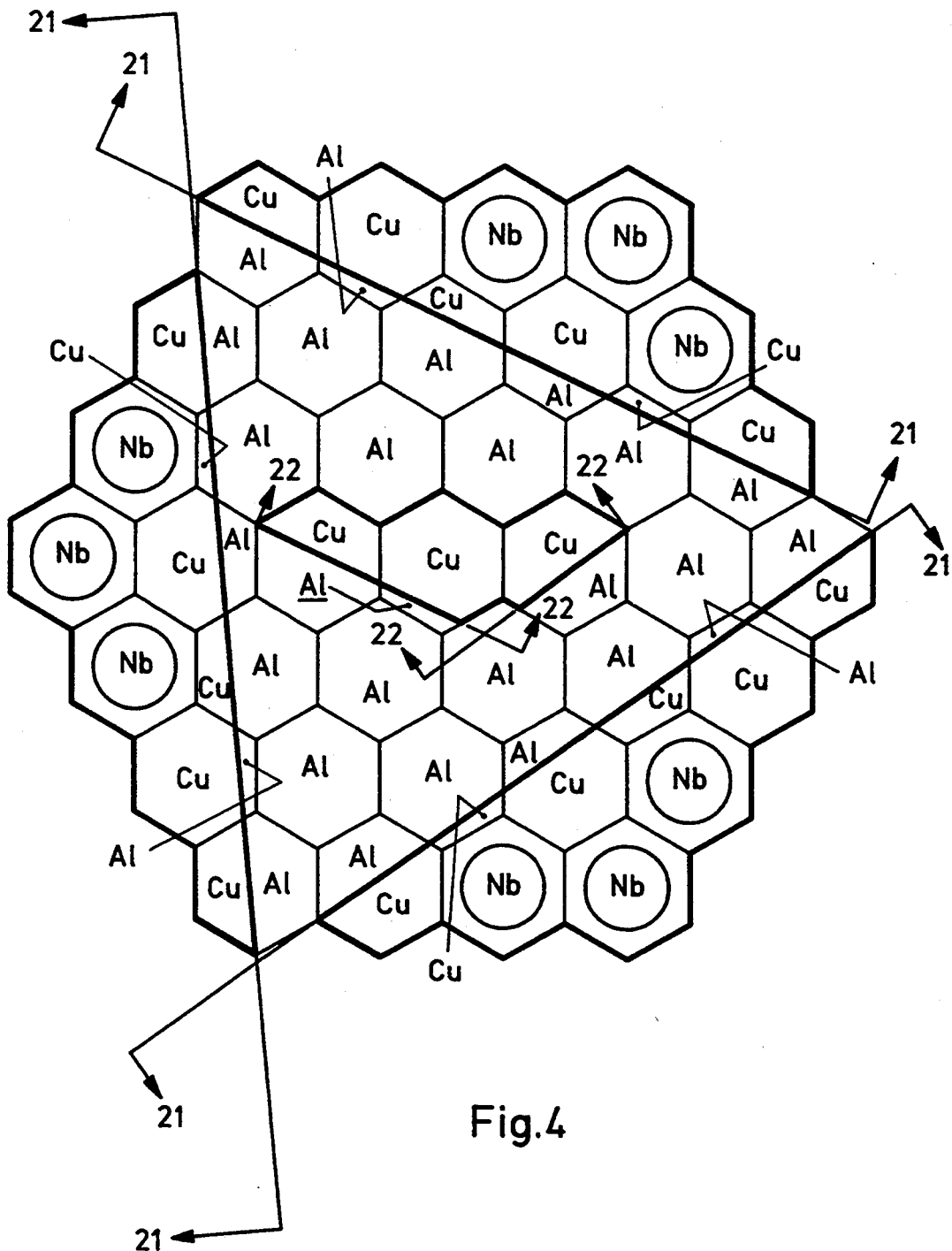

The invention will now be described by way of example with reference to the accompanying drawings, in which FIG. 1 is cross-section of a cylindrical component according to the invention, roughly full-size, FIG. 1A is a cross-section of an alternative design to FIG. 1, FIG. 2 is a cross-section of an intermediate member according to the invention, also roughly full-size, FIG. 3 is a cross-section of an assembly of several of the FIG. 2 intermediate members, and FIG. 4 is a cross-section of a special intermediate, shown enlarged about tenfold (linear magnification), used in the preparation of external filler strips for the intermediate member.

Turning to FIGS. 1 and 1A (which are alternatives), a cylindrical component 10 comprises a central duodecagonal pillar 1 of aluminium surrounded by a two-deep array of polygonal copper tubes 2 each containing a rod or filament of niobium. Of the thirty tubes 2, twentyfour will be seen to be regular hexagons, the rest 2a being of a specific pentagonal shape (nearly as easy to make both as regards copper and niobium) to fill the shape. (It could be envisaged for the six 2a and the six others on the inner ring to have an arcuate inner edge, to encircle a circular cross-sectional pillar 1. Other variations are also possible. However, the layout in the Figures represents an optimal volume ratio of aluminium to niobium.) Temporarily, the component 10 is surrounded by aluminium filler strips 6 encased in a strippable copper protective sheath 7, the whole being substantially void-free and readily extrudable. The whole is preheated to 200° C. to promote bonding of the structure.

The whole is extruded to one-thirtieth of the starting cross-sectional area, maintaining the hexagonal (FIG. 1) or circular (FIG. 1A) cross-section, whereby internal compression is isotropic and the shape (despite the thirtyfold reduction) is not disturbed at all. Much work is done, and hence heat is generated, during this operation, and the temperature rises to a level which would have melted tin but does not melt the aluminium. The heat usefully bonds the copper tubes 2 together.

The copper sheath 7 is stripped off and the aluminium filler strips 6 are removed by dissolution in caustic soda. The (reduced) component 10 is assembled in close-packed (void-free) array with sixty more in a generally hexagonal array to form an Intermediate Member, indicated as "20" in FIG. 2.

There are now several choices of route to the desired superconductor wire. Five examples will be described.

Route 1. For this route, it may be convenient to go directly to a larger hexagonal array of components 10, the next larger size containing ninety-one of them, and the next size again containing 127.

The Intermediate Member (the array of sixty-one (or 91 or 127) components 10) is then surrounded (In the "sixty-one" version as shown in FIG. 2) by twentyfour filler strips 21 and six corner filler strips 22 to present a regular hexagonal exterior. This is wrapped in tantalum foil 23, which acts as a tin diffusion barrier. In this and the alternative Routes, the Intermediate Member wrapped in tantalum foil 23 may then be wrapped in niobium foil, not shown. (The filler strips 21 and 22 are described in more detail later.)

Let this be Stage A. Then arcuate filler strips of copper are applied around the tantalum foil 23 (or of course the niobium foil if present), the copper strips being so profiled as voidlessly to encase the foil 23 in a right-circular cylinder. This is inserted into a copper extrusion can, the copper being a necessary part of the final product as explained above, and the whole drawn to the final wire size. Let this be Stage B.

Route 2. The Intermediate Member (the array of sixty-one components 10), item 20 of FIG. 2, is surrounded by twenty-four filler strips 21 and six corner filler strips 22 to present a regular hexagonal exterior. This is wrapped in tantalum foil 23, which acts as a tin diffusion barrier. (The filler strips 21 and 22 are described in more detail later.) A thicker tantalum can may be expedient in some cases, instead. Let this be Stage A. This is extruded down to one-tenth of its starting area. Let that be Stage B. The tantalum-clad extrusion-reduced Intermediate Member is inserted into a close-fitting hexagonal copper tube, and seven (or nineteen, thirty-seven, sixty-one . . . ) of the tubes are assembled into a close-packed hexagonal array. Aluminium arcuate filler strips are applied to the outside of this array, so profiled as voidlessly to encase the array in a hexagon or right-circular cylinder as convenient; this is inserted into a copper extrusion can and extruded and-/or drawn to the final wire size. The copper can may then be removed (by dissolution in nitric acid), and then the aluminium (by dissolution in caustic soda).

Route 3. This is identical to Route 2 except for a modification in case there is no access to a hexagonal-to-hexagonal extrusion press as is necessary immediately after Stage A. in Route 3, Stage A is followed by applying arcuate aluminium filler strips to the outside of this array, so profiled as voidlessly to encase it in a right circular cylinder, which is canned in copper. This is subjected to circular→circular extrusion to one-tenth of its starting area. The copper is then removed by dissolution in nitric acid, followed by the aluminium (dissolved in caustic soda). This is Stage B, and Route 2 is rejoined at that point. Route 4. The Intermediate Member (the array of sixty-one components 10), item 20 of FIG. 2, is surrounded by twenty-four filler strips 21 and six corner filler strips 22 to present a regular hexagonal exterior. This is wrapped in aluminium foil and then inserted into a hexagonal copper extrusion can, the aluminium serving as a copper-copper antibonding layer. This is Stage A. The whole is extruded to one-tenth of its starting area. This is Stage B. The copper can is dissolved away by dissolution in nitric acid and the aluminium foil is dissolved away by dissolution in caustic soda. The resultant reduced Intermediate Member has a space-filling cross section, and seven (or 19 or 37 . . . ) of them are voidlessly stacked in hexagonal array. That array is wrapped in tantalum foil (to act as a tin diffusion barrier) and arcuate copper fillers are applied round it, so profiled as voidlessly to encase the foil in a right-circular cylinder. This is inserted into a copper extrusion can, the copper being a necessary part of the final product as explained above, and the whole drawn to the final wire size.

Route 5. The intention is to assemble seven Intermediate Members 20 in hexagonal array, as shown in FIG. 3, to form the final superconducting wire. These Members are notionally labelled $20^1, 20^2 \ldots 20^7$, according to their intended individual positions in the hexagonal array. Member $20^1$ is made into a regular hexagon by adding filler strips $-21$ and $-22$ as explained in FIG. 4 later. It is wrapped in aluminium foil (to serve as a copper-copper antibonding layer) and Inserted into a hexagonal copper extrusion can. Members $20^2$–$20^7$, which are in fact identical, are each made into a regular hexagon by adding the filler strips $-21$ and $-22$ to three adjacent sides (those which will abut other Members 20) and adding strips $+21$ and $+22$ to the remaining (open) three sides. The strips $-21$ and $-22$ have the same shape as their counterparts $+21$ and $+22$ but are of aluminium. ($+21$ and $+22$ are identical to 21 and 22 of FIG. 4.) Then the Members $20^2$–$20^7$ are each wrapped in aluminium foil and inserted into a hexagonal copper extrusion can. This is Stage A. Then all seven Members are separately extruded to one-tenth of their area. That is Stage B. The copper extrusion can is dissolved away using nitric acid, and the aluminium (foil, and strips $-21$ and $-22$) is dissolved away using caustic soda. The seven Members $20^1$–$20^7$ can now be voidlessly stacked as originally envisaged in FIG. 3. It will be observed that they cannot in fact be assembled in any other than the correct orientations. That stack is is wrapped in tantalum foil (to act as a tin diffusion barrier) and arcuate copper fillers are applied round it, so profiled as voidlessly to encase the foil in a right-circular cylinder. This is inserted into a copper extrusion can, the copper being a necessary part of the final product as explained above, and the whole drawn to the final wire size. That final drawing, If started at 77K, allows quite a respectable reduction such as to 1/10 of area without exceeding an output temperature of 200C. In that way, the tin (explained in a moment) is not melted.

At either Stage A or B of any Route, the aluminium pillars 1 are dissolved out using hot sodium hydroxide. Stage A is preferable because that dissolution is easier but Stage B is also preferable because the A→B extrusion is easier with aluminium in the pillars 1 than with its replacement. The aluminium is replaced by solid tin pillars or by molten tin, which is caused to flow into the pillars 1.

The product of each Route may be bench-drawn then taken through wire dies as required, and the wire made into a winding as necessary for an electrical machine. By this time the individual columns 2 are filaments under ten microns across. Nonetheless, they retain an excellent parallelness along the length of the product and an excellent regularity of spacing, even across the boundary from one component 10 or even Member 20 to the next. The product is lightly twisted in use (e,g. 1 turn per cm) in order to decouple the filaments electrically. Though helical, the filaments remain parallel within the meaning of this specification.

Then (or at any time after the tin was introduced if there was to be no subsequent strain greater than about 0.2% within the wire) the wire is heat-treated. The tin in the pillars 1 diffuses through the copper matrix to the niobium (at no point having any great distance to go), forming in situ $Nb_3Sn$ (A15) superconductive kilofilament (but non-touching) wires.

Turning to FIG. 4, a special intermediate is shown enlarged for clarity, made up of hexagonal and part-hexagonal columns, which are identical to the tubes 2 of FIG. 1 in hexagon size, and some of which are further identical in that they contain niobium filaments. The composition of each column is shown. Despite the apparent complexity of the part-hexagonal columns, only three different pairs of part-hexagonal dies are needed altogether. The special intermediate is geometrically the same as the component 10 of FIG. 1 and is extruded in the same way.

Then it is disassembled by etching in hot caustic soda (which removes the aluminium) to yield the filler strips 21 and 22 (as labelled), which were mentioned above.

These filler strips serve to preserve the overall optimum composition and, by filling the space, allow the subsequent extrusions to be performed with no distortion of the niobium filaments, thereby at the same time allowing a full use of the volume for conductors (not wasting it with voids or excess inert material) and minimising the incidence of adjacent niobium filaments touching, which would allow wasteful eddy currents lateral to the filaments; in other words our actual filament diameter should closely approximate to the "effective diameter", which in the prior art is wastefully large because of touching filaments. The products of Route 2 or 3 show a network of 'veins' of tantalum and pure copper throughout their thickness. Although this is a loss of potential superconducting volume, it improves the safety margin if there is localised heating to above the superconducting temperature, by providing a nearby 'relief pathway' for accepting current and removing excess heat. The products of Route 1, 4 or 5, on the other hand, have tantalum and pure copper on the outside only, such that—the total amount of copper being held the same—the volume proportion of tantalum is less for a given barrier thickness. This improves the current-carrying capacity per unit cross-sectional area of the wire but reduces the electrothermal stability of the wire.

We claim:

1. A method of fabricating an elongated artefact comprising a matrix containing spaced parallel filaments along the direction of elongation, the method comprising substantially voidlessly stacking filaments each encased in a tube of matrix material to form an assembly having a space-filling shape, applying filler strips and a reduction can, reducing the canned assembly, removing the can and the filler strips, substantially voidlessly stacking a plurality of the reduced assemblies and reducing that stacked plurality.

2. A method according to claim 1, wherein the reduction is by extrusion.

3. A method according to claim 1, wherein the stacked plurality has filler strips and a reduction can applied to it before it is reduced.

4. A method according to any one of the preceding claims, further comprising substantially voidlessly stacking the reduced pluralities and reducing that stack of pluralities.

5. A method according to claim 1, wherein the assembly comprises, in addition to said filaments encased in tubes, a pillar of another material.

6. A method according to claim 5 wherein said pillar comprises tin, gallium, germanium.

7. A method according to claim 1, wherein the matrix material comprises copper and the filaments comprise niobium.

8. A method according to claim 6, further comprising the steps of selecting the materials for their suitability in fabricating superconducting wire, arranging the encased filaments so as to surround the pillar in a two-deep array, at least the outer set of said matrix-material encasements being polygonal, and reducing the said stacked plurality in such a way as to form a plane-filling shape.

9. A method according to claim 8, wherein the filler strips comprise cupriferous tubes containing niobiferous filaments.

10. A method according to claim 8, wherein the member is surrounded by a diffusion barrier.

11. A method according to claim 10, wherein the member is worked into the shape of a wire.

12. A method according to claim 9, wherein the central pillars are of an extrudable removable precursor of a material selected from the group consisting of stanniferous, galliferous and germaniferous materials, and wherein the method further comprises the steps of removing and replacing said precursor with one of a stanniferous, galliferous and germaniferous material, and heat-treating the member to diffuse the tin, gallium and germanium, respectively, across the tubes into the filaments to form the superconductor.

13. A method according to claim 9, wherein the central pillars are of one of a stanniferous, galliferous, aluminiferous and germaniferous material and wherein the method further comprises heat-treating the member to diffuse the tin, gallium, aluminium and germanium, respectively, across the tubes into the filaments to form the superconductor.

* * * * *